United States Patent [19]

Newton

[11] 4,430,624
[45] Feb. 7, 1984

[54] CURRENT MIRROR CIRCUIT ARRANGEMENT

[75] Inventor: Anthony D. Newton, Geneva, Switzerland

[73] Assignee: Motorola, Inc., Schaumburg, Ill.

[21] Appl. No.: 391,633

[22] Filed: Jun. 24, 1982

[51] Int. Cl.³ .............................................. H03F 3/10
[52] U.S. Cl. .................................... 330/288; 323/315
[58] Field of Search ................ 330/288; 323/315, 316

[56] References Cited

U.S. PATENT DOCUMENTS

| | | | |
|---|---|---|---|
| 3,651,346 | 3/1972 | Limberg | 330/288 X |
| 4,228,404 | 10/1980 | Widlar | 330/288 X |
| 4,329,639 | 5/1982 | Davis | 330/288 X |

Primary Examiner—James B. Mullins
Attorney, Agent, or Firm—Joe E. Barbee

[57] ABSTRACT

A current mirror circuit arrangement wherein an output current is provided by an output transistor and coupled between the base electrode of the output transistor and a reference potential is a series combination of a resistor and a diode. Signals are fed to the base electrode of the output transistor from a voltage supply via an emitter follower circuit and a resistor is connected across the diode so as to share current with the diode to increase its impedance at low current values and consequently to improve the overall linearity of the output current input voltage characteristic.

7 Claims, 8 Drawing Figures

*- PRIOR ART -*

$$\text{SLOPE } \frac{\delta I_{OUT}}{\delta I_{IN}} = C$$

— PRIOR ART —

CURRENT MIRROR CIRCUIT ARRANGEMENT

TECHNICAL FIELD

This invention relates to a current mirror circuit arrangement. Such circuit arrangements are useful in television video circuits when it is required to change the level of a signal, for example from a relatively high voltage to a lower voltage.

BACKGROUND ART

A known current mirror circuit arrangement includes an output transistor whose collector electrode provides an output current and whose emitter electrode is connected to a reference potential via a current control resistor.

Connected between the base electrode of the output transistor and the reference potential is a series combination of a resistor and a diode, the diode usually taking the form of a transistor whose base and collector electrodes are directly connected together.

The above known circuit is conveniently driven from a current source which provides an input current and in this case the input and output currents are directly proportional to one another. That is to say any change in the input current fed to the current mirror circuit produces a substantially proportional change in the output current provided by the output transistor.

This linear relationship applies over a wide range of input and output currents provided that the output transistor has a satisfactory value of current gain and that the matching of emitter areas of the diode and output transistors is good. Also provided that the resistors connected in the emitter circuit of the output transistor and to the diode respectively are of equal value, the output and input currents will be equal to one another.

Although the relationship between input and output currents in the above circuit is linear the actual input impedance is not linear with respect to the input current.

The input impedance depends upon the sum of the values of the impedances of the fixed resistor and the diode connected between the base electrode of the output transistor and the reference potential.

The value of the internal impedance of the diode is dependent upon the magnitude of the current flowing through the diode. The greater the magnitude of the current through the diode the smaller is its internal impedance.

A problem arises with the above known current mirror circuit arrangement in that it is often not convenient to drive the circuit from a current source. This would usually be the case when the circuit is used as part of a television video circuit.

In this case the circuit would be driven either from a voltage source or, as is more likely, from a non-ideal current source formed by a voltage source and a series resistor.

In the former case in which a voltage source is used the series-connected resistor and diode would have no effect on the input voltage/output current characteristic. This would be dependent upon the internal emitter impedance of the output transistor and since, like that of the diode, this impedance varies non-linearly with current, becoming smaller at higher current values, this characteristic would be non-linear at lower currents only approaching linearity at high current values.

Similarly in the second case of a non ideal current source the input voltage/output current characteristic is non linear this non-linearity depending upon the relationship of the total fixed resistance, formed by the sum of the series resistance connected to the voltage source, referred to as the source resistance, and the resistance connected in series with the diode, to the value of the variable component formed by the internal impedance of the diode.

Since the variable component becomes more negligible at higher-currents a known solution to the problem of non-linearity is to drive the current mirror circuit at high current levels. This solution is, however unsatisfactory since operation at high currents is wasteful of current and increases thermal dissipation. Consequently, specifications for integrated circuits utilising current mirror circuits increasingly require the use of relatively low currents at which the non-linearity problem would occur yet still require a linear input voltage/output current characteristic.

Further, integrated circuits frequently operate from relatively low voltage power supplies and the use of high currents under these circumstances can cause problems due to the d-c voltage across circuit resistors.

BRIEF SUMMARY OF THE INVENTION

This invention seeks to provide a current mirror circuit arrangement in which the above problems of driving from a voltage supply are mitigated.

According to the present invention there is provided a current mirror circuit arrangement comprising a transistor having a base electrode, a collector electrode for providing an output current and an emitter electrode coupled to a reference potential; a series combination of resistive means and a diode coupled between the base electrode of the transistor and a reference potential; an input terminal for receiving an input signal voltage; impedance means coupled between the input terminal and the base electrode of the transistor and an impedance connected to share current, with the diode wherein the linearity of the output current/input signal voltage characteristic may be controlled in dependence upon the magnitude of the said impedance.

The said impedance may comprise a current source.

In a preferred embodiment the said impedance is a resistor connected to pass-current in parallel with the diode.

The diode may be formed by a transistor having its base and collector electrodes connected directly together.

The impedance means may include an emitter-follower transistor having a base electrode coupled to the input terminal and an emitter electrode coupled to the base electrode of the said transistor.

The emitter electrode of the emitter follower transistor may be coupled to the base electrode of the transistor by means of a resistor.

BRIEF DESCRIPTION OF DRAWINGS

An exemplary embodiment of the invention will now be described with reference to the drawings in which.

DETAILED DESCRIPTION OF INVENTION

Figure 1:
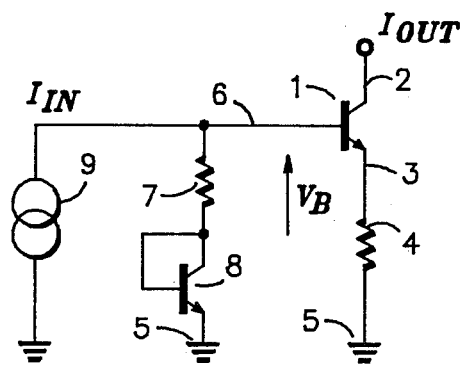
FIG. 1 shows a schematic illustration of a known current mirror circuit arrangement.

Referring now to FIG. 1 of the drawings there is shown a known current mirror circuit arrangement which includes an NPN transistor 1 having a collector electrode 2 for providing an output current and an emitter electrode 3 which is connected via a resistor 4 of value $R_2$ to earth reference potential 5. The transistor 1 also has a base electrode 6 which is coupled via a series combination of a resistor 7 of value $R_1$ and a diode 8 to the earth reference potential 5. The diode 8 is formed by an NPN transistor whose base and collector electrodes are connected directly together. The circuit arrangement is completed by a current source 9 which provides an input current to the base electrode 6 of the transistor 1.

The operation of the circuit arrangement of FIG. 1 is very well known and this circuit provides an output current $I_{out}$ from the collector electrode 2 of transistor 1 which is directly proportional to an input current $I_{in}$ fed to the base electrode 6 of the transistor 1 from the current source 9. Also any change $\delta I_{in}$ of the input current $I_{in}$ produces a substantially proportional change $\delta I_{out}$ of the output current i.e.

$$\frac{\delta I_{out}}{\delta I_{in}} = C$$

where C is a constant.

This relationship holds true for wide ranges of input and output currents providing that the $\beta$ value of the transistor 1 is satisfactory and the matching of the emitter areas of the transistor 1 and the transistor forming the diode 8 is good. With equal values for the resistors 4 and 7 and equal emitter areas then the constant C will have the value of unity.

Figure 2:
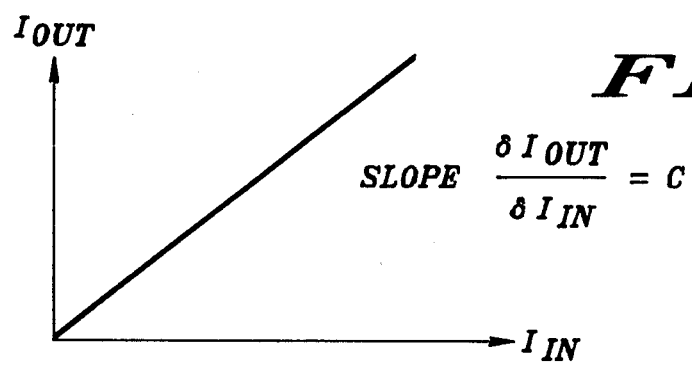
FIGS. 2 and 3 illustrate characteristic operating curves for the arrangement of FIG. 1.

The relationship between the output current $I_{out}$ and the input current $I_{in}$ is illustrated in FIG. 2 which is considered to be self-explanatory.

Although the output/input current characteristic of the circuit arrangement of FIG. 1 is linear, the actual input resistance is non-linear and is given by $R_{in} = R1 + r_{eD}$ where $r_{eD}$ is the dynamic resistance of the diode 8 and is given by $r_{eD} = KT/q|I_c|$, q being the charge on the electron, K is Boltzmann's constant, T is temperature in degrees K and $|I_c|$ is the quiescent current through the diode 8.

Figure 3:
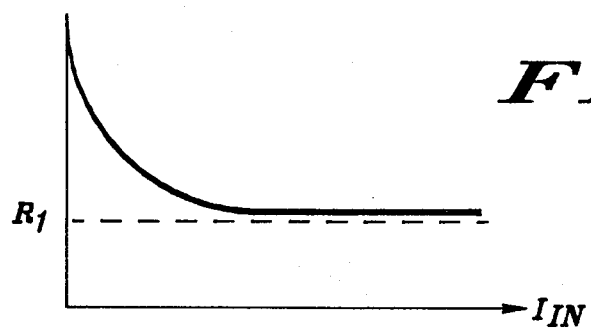

The value of this input resistance as a function of input current is shown in FIG. 3 of the drawings.

Figure 4:
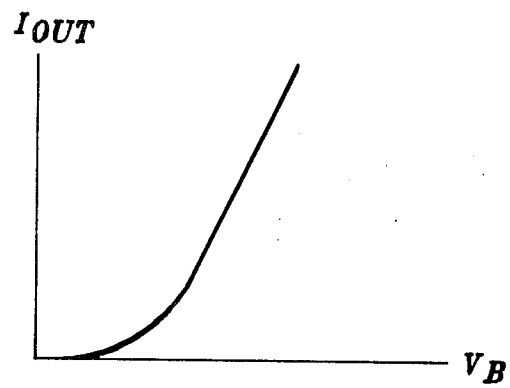
FIGS. 4 and 5 illustrate characteristic curves for a current mirror circuit arrangement driven by a voltage source.

If the current source 9 of FIG. 1 were to be replaced by a voltage source, then the impedances of the resistor 7 and the diode 8 would have no effect on input voltage/output current characteristic and this would be as illustrated in FIG. 4 of the drawings.

Figure 5:
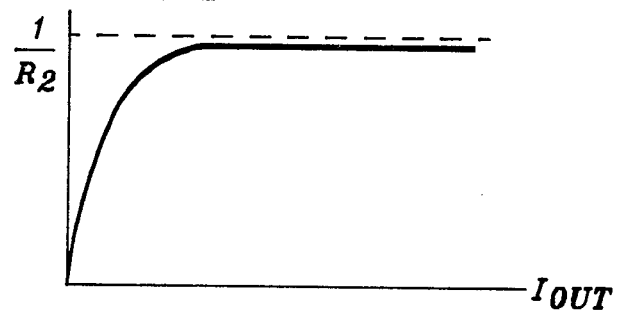

Referring now to FIG. 5 of the drawings this shows the incremental transconductance plotted against the output current $I_{out}$ for the circuit arrangement of FIG. 1 when fed by a voltage source.

Figure 6:
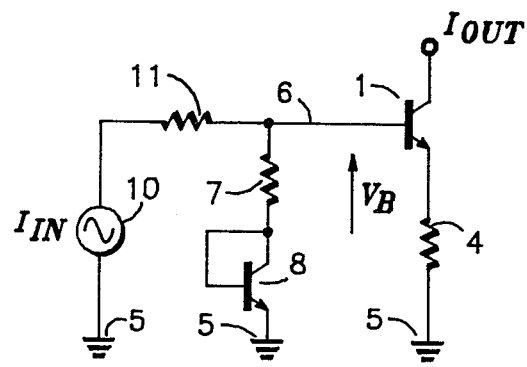
FIG. 6 shows another known current mirror circuit arrangement.

Referring now to FIG. 6 where like parts to those in FIG. 1 bear like reference numerals the current source for feeding the circuit arrangement is now replaced by a voltage source 10 which provides a voltage $V_{in}$ and this voltage source 10 is coupled to the base electrode 6 of the transistor 1 via a series resistor 11. It is often required in integrated circuits to use a circuit similar to that shown in FIG. 6 and in this case the input voltage $V_{in}$/output current $I_{out}$ characteristic is also non-linear. The degree of this non-linearity depends upon the relationship between input current and input voltage since as seen from the circuit shown in FIG. 1 the relationship between input current and output current is linear. The degree of this non-linearity is dependent upon the ratio of the value of the fixed resistance $R_1 + R_s$ of the resistors 7 and 11 respectively to the value of the variable component of resistance $r_{ed}$ which as seen above is given by $KT/q|I_{in}|$.

Whilst as mentioned above it is often desired to use a circuit similar to that shown in FIG. 6 it is also usually necessary that the output current varies in a linear manner with changes in the input voltage. This is only possible in the circuit of FIG. 6 when the current flowing through the diode 8 is large so that the impedance of this diode becomes negligible. However, as explained above this is very wasteful of current and increases thermal dissipation and causes problems due to the DC voltages across the resistors in the circuit when the power supply has only a low voltage.

The above problems with the FIG. 6 arrangement are mitigated by use of a circuit arrangement in accordance with the present invention one embodiment of which will now be described with reference to FIG. 7.

In this figure where like parts to those in FIG. 1 bear like reference numerals input signals to the circuit are supplied from a voltage source to an input terminal 12 which is connected to base electrode 13 of an emitter follower transistor 14. The transistor 14 has a fixed resistor 15 in its emitter circuit which resistor couples the emitter electrode to the base electrode 6 of the transistor 1. Finally connected directly across the diode 8 is an impedance in the form of a fixed resistor 16.

Figure 7:
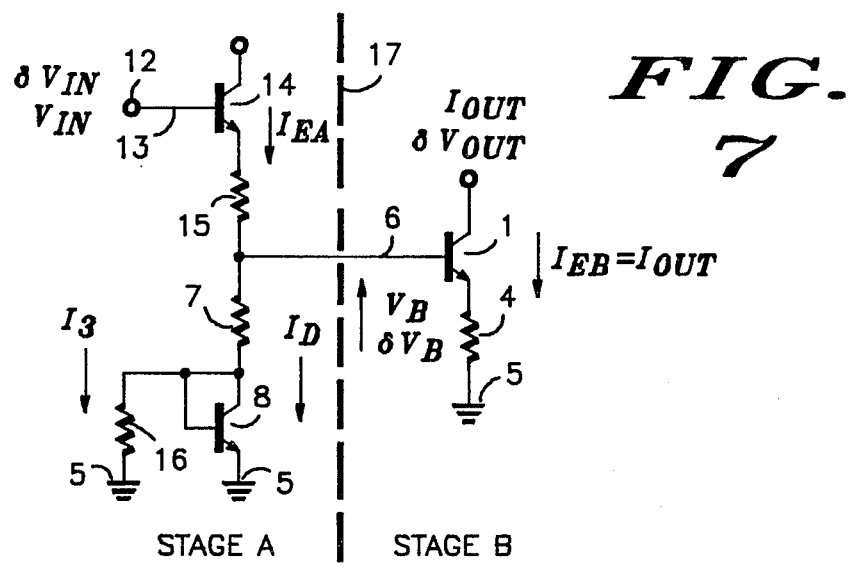
FIG. 7 illustrates a current mirror circuit arrangement in accordance with the present invention and FIG. 8 is a graph illustrating the operation of the circuit arrangement of FIG. 7.

In considering the operation of the arrangement shown in FIG. 7 the circuit will be divided into two halves referenced Stage A and Stage B, Stage A being to the left as viewed of a dashed line 17 whilst Stage B lies to the right of this dashed line. Considering firstly the transconductance of Stage B this will depend upon the current through the transistor 1 since the transconductance depends upon the internal emitter resistance $r_{eB}$ of the transistor 1 which internal resistance is current dependent.

The transconductance $$g_B = \frac{I_{out}}{V_B}$$

where $V_B$ is the voltage appearing at the base electrode 6 of the transistor 1. Therefore $g_B = 1/R_2 + r_{eB}$ The value of the voltage $V_B$ appearing at the base electrode 6 of the transistor 1 will depend upon the gain of Stage A which is given by $\delta V_B/\delta V_{in}$ The value of this gain will depend upon the potential appearing at the base electrode 6 of the transistor 1 and will be determined by the potential appearing at the junction of the resistors 15 and 7. This potential will of course in turn depend upon the value of the impedance of the combination formed by the resistor 7 in series with the diode 8 which is itself connected in parallel with the resistor 16. The gain of Stage A therefore will also depend upon the combined impedance of the diode 8 in parallel with the resistor 16. The overall gain of the circuit arrangement will be the product of the gains of Stages A and B. In order to be able to evaluate these gains it will be necessary to choose values for the resistors in the circuit arrangment. For convenience of explanation it will be assumed that the resistors 7 and 15 are of equal value and equal 1K ohm. The value of the resistor 4 is also assumed to be 1K ohm.

Firstly assume that the resistor 16 has a value of infinity. The circuit arrangement will then be equivalent to that of FIG. 6 in which there is effectively no parallel impedance connected across the diode 8. Since the diode 8 and the transistor 14 pass equal currents their emitter resistances will be equal and therefore the voltage $V_B$ appearing at the base electrode 6 will be one half the value $V_{in}$ and the gain of Stage A will therefore be 0.5 and will be independent of the current through the diode 8. This is illustrated in FIG. 8 where gain is plotted as a function of current through the diode 8 and the gain of Stage A with the resistor 16 chosen to be infinity is shown by the dashed line curve (a).

Figure 8:
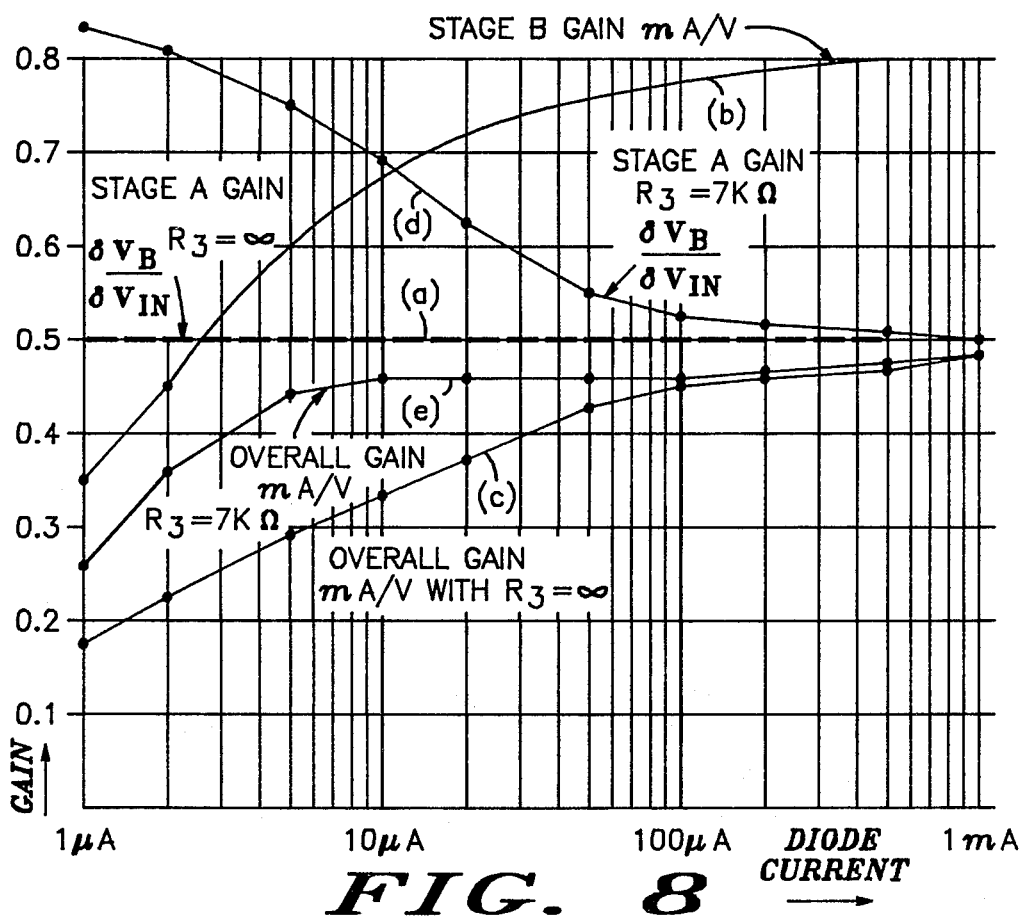

The gain of Stage B as a function of collector current through the diode 8 1 is shown in FIG. 8 by the curve (b) and the overall gain of the circuit arrangement is the product of these two curves which is shown as curve (c).

As can be seen from curve (c) in FIG. 8 it is not until an operating current of 200 microamps is reached that the circuit reaches 95% of its maximum gain. This high value of current is as explained above generally unacceptable.

Assume now that the resistor 16 has a value less than infinity and for the purposes of explanation the value will be assumed to be 7K ohms. For a given value of current through the transistor 14, the diode 8 and the resistor 16 will now share current so that the current through the diode 8 will be effectively reduced. Since the impedance of the diode 8 is inversely proportional to current through the diode then the overall impedance of the combination of the resistor 7, the diode 8 and the resistor 16 will be increased, and for a given input voltage $V_{in}$ applied to the terminal 12 the voltage $V_B$ appearing at the base electrode 6 of the transistor 1 will be increased and the effective gain of Stage A will be increased.

The gain of Stage A as a function of current through the diode 8 will now be as shown by curve (d) in FIG. 8. The overall gain of the circuit arrangement will now be the product of curves (d) and (b), this latter curve being unaffected by the impedance 16 and this overall gain will be as shown in curve (e).

As can be seen in curve (e) the overall gain of Stages A and B now reaches 95% of its final value by a current of 10 microamps and the linearity of the overall gain has been improved considerably.

The procedure used to plot the graphs in FIG. 8 is as follows:

A. The current in the diode 8 is assigned a value.
B. The dynamic impedance of the diode is calculated.
C. The parallel value of the impedances of the diode 8 and the resistor 16, this latter impedance hereinafter being referred to as $R_3$, is calculated.
D. The voltage across the diode 8 calculated from its known characteristic.
E. From the calculated diode voltage and the assigned current, the current in $R_3$ is calculated.
F. The current in the emitter follower transistor 14 is calculated and is given by $I_{EA} = I_D + I_3$ where $I_{EA}$, $I_D$ and $I_3$ are as shown on FIG. 7 of the drawings.
G. The dynamic impedance of the emitter follower transistor 14 is calculated and is given by $$r_{eA} = \frac{KT}{q} |1/I_{EA}|$$

H. The gain of Stage A is calculated and is given by $$\left( \frac{r_{eD} R_3}{R_3 + r_{eD}} + R_1 \right) / \frac{r_{eD} R_3}{r_{eD} + R_3} + R_1 + R_s + r_{eA}$$

I. $V_B$ is calculated and is given by $V_B = V_D + (I_D + I_3)R_s$.
J. $I_{EB}$ is calculated by successive approximation knowing $V_B$ and the base/emitter characteristic of the transistor 1.
K. $r_{eB}$ is calculated from $I_{EB}$.
L. The transconductance $g_B$ is calculated for Stage B and is given by $g_B = 1/R_2 + r_{eB}$.
M. $g_B$ is multiplied by $G_A$ to give the overal gain of the circuit.

The invention has been described by way of example and it must be appreciated that modifications may be made without departing from the scope of the invention. For example values assigned to the circuit components have been chosen by way of example and other suitable values may be chosen if required. In addition although the impedance connected across the diode 8 is shown as a fixed resistor this is not essential and any suitable impedance, such as a current source, which diverts current from the diode 8 to increase its effective impedance at low current values may be used.

I claim:

1. A current mirror circuit arrangement comprising a transistor having a base electrode, a collector electrode for providing an output current and an emitter electrode coupled to a supply terminal; an input terminal for receiving an input signal voltage; impedance means coupled between the input terminal and the base electrode of the transistor; a series combination of resistive means and a diode coupled between the base electrode of the transistor and a supply terminal; and an impedance connected to share current with the diode such that a combination formed by the diode and the impedance is in series with the resistive means wherein the linearity of the output current/input signal voltage characteristic may be controlled in dependence upon the magnitude of said impedance.

2. A current mirror circuit arrangement as claimed in claim 1 wherein the said impedance is a current source.

3. A current mirror circuit arrangement as claimed in claim 1 wherein the said impedance is a resistor connected to pass current in parallel with the diode.

4. A current mirror circuit arrangement as claimed in claim 1 or 2 or 3 wherein the diode is formed by a transistor having its base and collector electrodes connected directly together.

5. A current mirror circuit arrangement as claimed in claim 1 wherein the impedance means includes an emitter follower transistor having a base electrode coupled to the input terminal and an emitter electrode coupled to the base electrode of the said transistor.

6. A current mirror circuit arrangement as claimed in claim 5 wherein the emitter electrode of the emitter follow transistor is coupled to the base electrode of the said transistor by means of a resistor.

7. A current mirror circuit arrangement comprising a transistor having a base electrode, a collector electrode for providing an output current and an emitter electrode; an input terminal for receiving an input signal voltage; means including first resistive means coupled between the input terminal and the base electrode of the transistor; a series combination of a diode and second resistive means coupled between the base electrode of the transistor and a supply terminal; and third resistive means connected to share current with the diode so that a combination of the diode and the third resistive means is in series with the second resistive means whereby the linearity of the output current/input signal voltage characteristic may be controlled in dependence upon the magnitude of the third resistive means.

* * * * *